United States Patent
Swaminathan et al.

(10) Patent No.: US 8,939,347 B2
(45) Date of Patent: Jan. 27, 2015

(54) MAGNETIC INTERMETALLIC COMPOUND INTERCONNECT

(75) Inventors: Rajasekaran Swaminathan, Chandler, AZ (US); Ravindranath V. Mahajan, Chandler, AZ (US)

(73) Assignee: Intel Corporation, Santa Clara ( * ) Notice: Subject to any disclaimer, the term of this patent is extended or adjusted under 35 U.S.C. 154(b) by 517 days.

(21) Appl. No.: 12/768,842

(22) Filed: Apr. 28, 2010

(65) Prior Publication Data

US 2011/0266030 A1  Nov. 3, 2011

(51) Int. Cl.
*B23K 31/02*  (2006.01)
*B23K 35/12*  (2006.01)
(Continued)

(52) U.S. Cl.
CPC ........... *H01L 23/49816* (2013.01); *B82Y 25/00* (2013.01); *H01L 23/49866* (2013.01); *H01L 24/11* (2013.01); *H01L 24/13* (2013.01); *H01L 24/81* (2013.01); *H01L 24/03* (2013.01); *H01L 24/05* (2013.01); *H01L 24/16* (2013.01); *H01L 2224/0345* (2013.01); *H01L 2224/03452* (2013.01); *H01L 2224/0401* (2013.01); *H01L 2224/05571* (2013.01); *H01L 2224/05624* (2013.01); *H01L 2224/05639* (2013.01); *H01L 2224/05644* (2013.01); *H01L 2224/05647* (2013.01); *H01L 2224/05666* (2013.01); *H01L 2224/1148* (2013.01); *H01L 2224/11849* (2013.01); *H01L 2224/13022* (2013.01); *H01L 2224/13082* (2013.01); *H01L 2224/13099* (2013.01); *H01L 2224/13147* (2013.01); *H01L 2224/13211* (2013.01); *H01L 2224/13239* (2013.01); *H01L 2224/13355* (2013.01); *H01L 2224/13357* (2013.01); *H01L 2224/1336* (2013.01); *H01L 2224/16227* (2013.01); *H01L 2224/81193* (2013.01); *H01L 2224/812* (2013.01); *H01L 2224/81385* (2013.01); *H01L 2224/81801* (2013.01);
(Continued)

(58) Field of Classification Search
USPC ........... 228/178–180.22, 245–255, 37, 122.1, 228/123.1, 124.1, 124.5
See application file for complete search history.

(56) References Cited

U.S. PATENT DOCUMENTS 3,839,727 A   10/1974  Herdzik et al.
4,983,804 A    1/1991  Chan et al.
(Continued)

FOREIGN PATENT DOCUMENTS

JP       2003275891 A  *  9/2003

OTHER PUBLICATIONS

JP 2003275891 A computer english translation.*
(Continued)

*Primary Examiner* — Erin Saad
(74) *Attorney, Agent, or Firm* — Winkle, PLLC

(57) ABSTRACT

The present disclosure relates to the field of fabricating microelectronic packages, wherein magnetic particles distributed within a solder paste may be used to form a magnetic intermetallic compound interconnect. The intermetallic compound interconnect may be exposed to a magnetic field, which can heat a solder material to a reflow temperature for attachment of microelectronic components comprising the microelectronic packages.

14 Claims, 8 Drawing Sheets

(51) Int. Cl.
  *H01L 23/498* (2006.01)
  *B82Y 25/00* (2011.01)
  *H01L 23/00* (2006.01)

(52) U.S. Cl.
  CPC ........... H01L 2924/01013 (2013.01); H01L 2924/01029 (2013.01); H01L 2924/01047 (2013.01); H01L 2924/01049 (2013.01); H01L 2924/01056 (2013.01); H01L 2924/01079 (2013.01); H01L 2924/01082 (2013.01); H01L 2924/01006 (2013.01); H01L 2924/01019 (2013.01); H01L 2924/01033 (2013.01); H01L 2924/0105 (2013.01); H01L 2924/01075 (2013.01); H01L 2924/01322 (2013.01); H01L 2924/014 (2013.01); H01L 2924/01327 (2013.01); H01L 2224/81191 (2013.01); H01L 2224/814 (2013.01); H01L 2224/16225 (2013.01)
  USPC ........ 228/178; 228/179.1; 228/180.1; 228/180.21; 228/180.22; 228/245; 228/246; 228/247; 228/248.1; 228/248.5; 228/249; 228/250; 228/251; 228/252; 228/255; 228/37; 228/122.1; 228/123.1; 228/124.1; 228/124.5

(56) References Cited

U.S. PATENT DOCUMENTS

| | | |
|---|---|---|
| 5,048,744 A | 9/1991 | Chang et al. |
| 5,093,545 A | 3/1992 | McGaffigan |
| 5,346,775 A | 9/1994 | Jin et al. |
| 5,353,498 A | 10/1994 | Fillion et al. |
| 5,497,033 A | 3/1996 | Fillion et al. |
| 5,509,815 A | 4/1996 | Jin et al. |
| 5,516,030 A | 5/1996 | Denton |
| 5,527,741 A | 6/1996 | Cole et al. |
| 5,830,292 A | 11/1998 | Eiter et al. |
| 5,838,069 A | 11/1998 | Itai et al. |
| 5,841,193 A | 11/1998 | Eichelberger |
| 5,846,366 A | 12/1998 | Jin et al. |
| 5,907,786 A | 5/1999 | Shinomiya |
| 5,953,629 A | 9/1999 | Imazeki et al. |
| 6,154,366 A | 11/2000 | Ma et al. |
| 6,159,767 A | 12/2000 | Eichelberger |
| 6,174,797 B1 | 1/2001 | Bao et al. |
| 6,239,482 B1 | 5/2001 | Fillion et al. |
| 6,242,282 B1 | 6/2001 | Fillion et al. |
| 6,271,469 B1 | 8/2001 | Ma et al. |
| 6,306,680 B1 | 10/2001 | Fillion et al. |
| 6,396,148 B1 | 5/2002 | Eichelberger et al. |
| 6,396,153 B2 | 5/2002 | Fillion et al. |
| 6,423,570 B1 | 7/2002 | Ma et al. |
| 6,426,545 B1 | 7/2002 | Eichelberger et al. |
| 6,454,159 B1 * | 9/2002 | Takushima ............ 228/253 |
| 6,459,150 B1 | 10/2002 | Wu et al. |
| 6,489,185 B1 | 12/2002 | Towle et al. |
| 6,555,906 B2 | 4/2003 | Towle et al. |
| 6,555,908 B1 | 4/2003 | Eichelberger et al. |
| 6,580,611 B1 | 6/2003 | Vandentop et al. |
| 6,586,276 B2 | 7/2003 | Towle et al. |
| 6,586,822 B1 | 7/2003 | Vu et al. |
| 6,586,836 B1 | 7/2003 | Ma et al. |
| 6,617,682 B1 | 9/2003 | Ma et al. |
| 6,642,485 B2 * | 11/2003 | Goenka et al. ............ 219/400 |
| 6,703,400 B2 | 3/2004 | Johnson et al. |
| 6,706,553 B2 | 3/2004 | Towle et al. |
| 6,709,898 B1 | 3/2004 | Ma et al. |
| 6,713,859 B1 | 3/2004 | Ma |
| 6,730,533 B2 | 5/2004 | Durocher et al. |
| 6,734,534 B1 | 5/2004 | Vu et al. |
| 6,794,223 B2 | 9/2004 | Ma et al. |
| 6,818,544 B2 | 11/2004 | Eichelberger et al. |
| 6,825,063 B2 | 11/2004 | Vu et al. |
| 6,841,413 B2 | 1/2005 | Liu et al. |
| 6,888,240 B2 | 5/2005 | Towle et al. |
| 6,894,399 B2 | 5/2005 | Vu et al. |
| 6,902,950 B2 | 6/2005 | Ma et al. |
| 6,964,889 B2 | 11/2005 | Ma et al. |
| 7,067,356 B2 | 6/2006 | Towle et al. |
| 7,071,024 B2 | 7/2006 | Towle et al. |
| 7,078,788 B2 | 7/2006 | Vu et al. |
| 7,109,055 B2 | 9/2006 | McDonald et al. |
| 7,112,467 B2 | 9/2006 | Eichelberger et al. |
| 7,160,755 B2 | 1/2007 | Lo et al. |
| 7,183,658 B2 | 2/2007 | Towle et al. |
| 7,189,596 B1 | 3/2007 | Mu et al. |
| 7,213,329 B2 | 5/2007 | Kim et al. |
| 7,416,918 B2 | 8/2008 | Ma |
| 7,420,273 B2 | 9/2008 | Liu et al. |
| 7,425,464 B2 | 9/2008 | Fay et al. |
| 7,442,581 B2 | 10/2008 | Lytle et al. |
| 7,476,563 B2 | 1/2009 | Mangrum et al. |
| 7,588,951 B2 | 9/2009 | Mangrum et al. |
| 7,595,226 B2 | 9/2009 | Lytle et al. |
| 7,619,901 B2 | 11/2009 | Eichelberger et al. |
| 7,632,715 B2 | 12/2009 | Hess et al. |
| 7,648,858 B2 | 1/2010 | Tang et al. |
| 7,651,021 B2 | 1/2010 | Supriya et al. |
| 7,651,889 B2 | 1/2010 | Tang et al. |
| 7,655,502 B2 | 2/2010 | Mangrum et al. |
| 7,659,143 B2 | 2/2010 | Tang et al. |
| 7,829,975 B2 | 11/2010 | Hayasaka et al. |
| 7,902,060 B2 | 3/2011 | Swaminathan |
| 8,183,677 B2 | 5/2012 | Meyer-Berg |
| 8,188,581 B2 | 5/2012 | Shi et al. |
| 8,313,958 B2 | 11/2012 | Swaminathan et al. |
| 8,434,668 B2 | 5/2013 | Aleksov et al. |
| 2002/0151164 A1 * | 10/2002 | Jiang et al. ................ 438/613 |
| 2002/0185309 A1 | 12/2002 | Imamura et al. |
| 2004/0013860 A1 | 1/2004 | Sumi et al. |
| 2007/0231961 A1 | 10/2007 | Teshirogi et al. |
| 2008/0048009 A1 | 2/2008 | Maeda et al. |
| 2008/0054448 A1 | 3/2008 | Lu et al. |
| 2008/0165518 A1 | 7/2008 | Ichiryu et al. |
| 2008/0283387 A1 | 11/2008 | Rice et al. |
| 2008/0315377 A1 | 12/2008 | Eichelberger et al. |
| 2008/0315391 A1 | 12/2008 | Kohl et al. |
| 2009/0027857 A1 | 1/2009 | Dean et al. |
| 2009/0072012 A1 | 3/2009 | Sakaguchi et al. |
| 2009/0072382 A1 | 3/2009 | Guzek |
| 2009/0079063 A1 | 3/2009 | Chrysler et al. |
| 2009/0079064 A1 | 3/2009 | Tang et al. |
| 2009/0166396 A1 | 7/2009 | Supriya et al. |
| 2009/0212416 A1 | 8/2009 | Skeete |
| 2009/0294942 A1 | 12/2009 | Palmer et al. |
| 2009/0301769 A1 | 12/2009 | Seppä et al. |
| 2010/0044855 A1 | 2/2010 | Eichelberger et al. |
| 2010/0047970 A1 | 2/2010 | Eichelberger et al. |
| 2010/0105171 A1 | 4/2010 | Lee et al. |
| 2010/0159692 A1 | 6/2010 | Swaminathan |
| 2010/0282823 A1 | 11/2010 | Ulicny et al. |
| 2011/0101491 A1 | 5/2011 | Skeete et al. |
| 2011/0108999 A1 | 5/2011 | Nalla et al. |
| 2011/0156231 A1 | 6/2011 | Guzek |
| 2011/0210283 A1 | 9/2011 | Ramirez et al. |
| 2011/0215464 A1 | 9/2011 | Guzek et al. |
| 2011/0228464 A1 | 9/2011 | Guzek et al. |
| 2011/0241186 A1 | 10/2011 | Nalla et al. |
| 2011/0241195 A1 | 10/2011 | Nalla et al. |
| 2011/0241215 A1 | 10/2011 | Sankman et al. |
| 2011/0254124 A1 | 10/2011 | Nalla et al. |
| 2011/0278044 A1 | 11/2011 | Aleksov et al. |
| 2011/0278351 A1 | 11/2011 | Aleksov et al. |
| 2011/0281375 A1 | 11/2011 | Swaminathan et al. |
| 2011/0291276 A1 | 12/2011 | Swaminathan et al. |
| 2012/0001339 A1 | 1/2012 | Malatkar |
| 2012/0009738 A1 | 1/2012 | Crawford et al. |

(56) References Cited

U.S. PATENT DOCUMENTS

2012/0049382 A1 3/2012 Malatkar
2013/0224444 A1 8/2013 Aleksov et al.

OTHER PUBLICATIONS

Habib, et al., "Novel Solder-Magnetic Particle Composites and Their Reflow Using AC Magnetic Fields", IEEE Transactions on Magnetics, vol. 46, No. 6, Jun. 2010, pp. 1-4.
"Yale Scientists Develop Magnetic Lead-free Solder", SMT Magazine Archive, Mar. 8, 2010, Retrieved on Dec. 6, 2010, Document Available at: <http://www.ems007.com/pages/zone.cgi?a=60208&artpg=1>, 2 pages.
U.S. Appl. No. 09/640,961, filed Aug. 16, 2000, 70 pages.
Office Action received for U.S. Appl. No. 12/343,341, Mailed on Sep. 15, 2010, 9 pages.
Calabro, Joshua D., et al. "Magnetically Driven Three-Dimensional Manipulation and Inductive Heating of Magnetic-Dispersion Containing Metal Alloys", Department of Mechanical Engineering, Yale University, New Haven, CT 06520; and Department of Materials Science and Engineering, Massachusetts Institute of Technology, Cambridge, PNAS, Mar. 16, 2010, vol. 107 No. 11 pp. 4834-4839.
McCormack, M. et al., "Enhanced Solder Alloy Performance by Magnetic Dispersions", IEEE Transactions on Components, Packaging, and Manufacturing Technology-Part A, vol. 17, No. 3, Sep. 1994, pp. 452-457.
Suwanwatana, W. et al., "Influence of particle size on hysteresis heating behavior of nickel particulate polymer films", Elsevier, Composites Science and Technology 66, May 30, 2006, pp. 2825-2836.
U.S. Appl. No. 12/787,968, filed May 26, 2010, 29 pages.
U.S. Appl. No. 12/778,335, filed May 12, 2010, 43 pages.
U.S. Appl. No. 12/778,313, filed May 12, 2010, 33 pages.
U.S. Appl. No. 12/777,476, filed May 11, 2010, 41 pages.

* cited by examiner

MAGNETIC INTERMETALLIC COMPOUND INTERCONNECT

BACKGROUND

A typical microelectronic package includes at least one microelectronic die that is mounted on a substrate such that bond pads on the microelectronic die are attached directly to corresponding bond lands on the substrate using reflowable solder balls.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
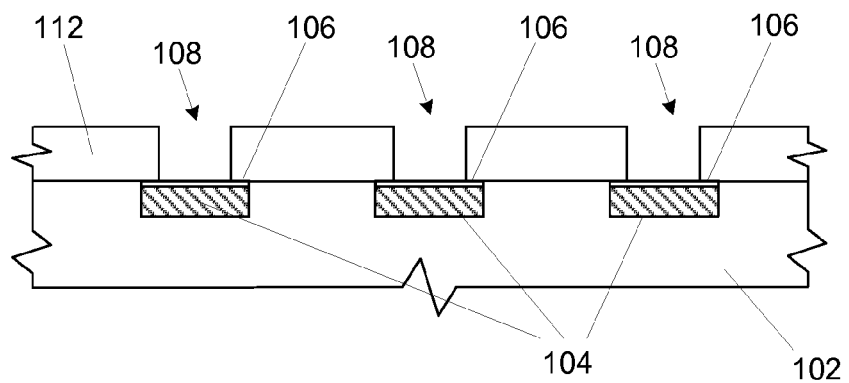
FIGS. 1-8 illustrate side cross-sectional views of a process of forming magnetic intermetallic compound interconnects on a substrate and the attachment of a microelectronic die to the substrate.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic packages, wherein magnetic particles distributed within a solder paste may be used to form a magnetic intermetallic compound interconnect. The intermetallic compound interconnect may be exposed to a magnetic field, which can heat a solder material to a reflow temperature for attaching microelectronic components comprising the microelectronic package.

In the production of microelectronic packages, microelectronic dice are generally mounted on substrates that may in turn be mounted to boards, which provide electrical communication routes between the microelectronic die and external components. A microelectronic die, such as a microprocessor, a chipset, a graphics device, a wireless device, a memory device, an application specific integrated circuit, or the like, may be attached to a substrate, such as an interposer, a motherboard, and the like, through a plurality of interconnects, such as reflowable solder bumps or balls, in a configuration generally known as a flip-chip or controlled collapse chip connection ("C4") configuration. When the microelectronic die is attached to the substrate with interconnects made of solder, the solder is reflowed (i.e. heated) to secure the solder between the microelectronic die bond pads and the substrate bond pads.

During such an attachment, a thermal expansion mismatch may occur between the microelectronic die and the substrate as the solder is heated to a reflow temperature and subsequently cooled after the attachment. This thermal expansion mismatch can warp the microelectronic package, as well as cause significant yield losses and failures due to, for example, stretched joint formation, solder bump cracking, under bump metallization failures, edge failures, and layer separation within the substrates and microelectronic dice, as will be understood to those skilled in the art.

FIGS. 1-8 illustrate an embodiment of using a magnetic material to locally heat interconnects according to one embodiment of the present disclosure. FIG. 1 shows a substrate 102 having at least one attachment structure, such as bond pads 104, formed therein. The substrate 102 may be primarily composed of any appropriate material, including, but not limited to, bismaleimine triazine resin, fire retardant grade 4 material, polyimide materials, glass reinforced epoxy matrix material, and the like, as well as laminates or multiple layers thereof. The substrate bond pads 104 may be composed of any conductive metal, including but not limited to, copper, aluminum, and alloys thereof. The substrate bond pads 104 may be in electrical communication with conductive traces (not shown) within the substrate 102.

Each substrate bond pad 104 may optionally include a finish layer 106 formed thereon. The finish layer 106 may be used to prevent oxidation of the substrate bond pad 104 and/or to increase the adhesion between the substrate bond pad 104 and a subsequently formed interconnect, as will be discussed. The finish layer 106 may include gold, nickel, copper, palladium, indium, and silver, and alloys thereof. In one embodiment, the finish layer 106 may be a single metal layer, such as layer of gold, which may be formed by a direct immersion gold process. In another embodiment, the finish layer 106 may be a metal alloy layer, such as a nickel/palladium/gold alloy, an indium/silver alloy, or various copper-based alloy surface finishes. In yet another embodiment, the finish layer 106 may be multiple layers of metals, such as a layer of gold on a layer of nickel, which may be formed by an electroless nickel/immersion gold ("ENIG") plating method followed by an electroless gold ("EG") plating method, as will be understood to those skilled in art.

An outer dielectric layer 112 may be formed adjacent the substrate 102 and the substrate bond pads 104, wherein openings 108 extend through the outer dielectric layer 112 to expose a portion of each of the substrate bond pads 104. The outer dielectric layer 112 may be a solder resist material, including but not limited to epoxy and epoxy-acrylate resins. The substrate 102, substrate bond pad 104, and the outer dielectric layer 112 may be formed by any known techniques, as will be understood by those skilled in the art.

Figure 2:
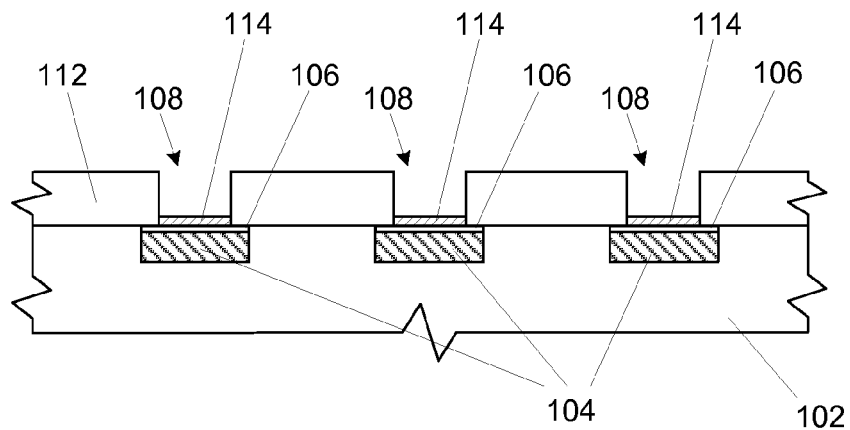

A magnetic composite material 114 may be deposited adjacent to the substrate bond pads 104, as shown in FIG. 2. As illustrated, the magnetic composite material 114 is deposited on the finish layer 106. The magnetic composite material 114 may comprise magnetic particles dispersed in a solder paste. In one embodiment, the magnetic composite material 114 may contain between about 1% and 10% by weight of magnetic particles. In another embodiment, the magnetic composite material 114 may have magnetic particles sized between about 5 and 100 nm in length. The magnetic composite material 114 may be deposited by any known technique including printing and spraying, and may be deposited to a thickness of between about 1 and 3 microns.

The magnetic particles may include, but are not limited to, iron (Fe), cobalt (Co), nickel (Ni), and their respective alloys. Examples may also include ferrites and oxides containing magnetic metals. In one embodiment, the magnetic particles may be $MFe_2O_4$, where M may be any metal and O is oxygen. In another embodiment, the magnetic particles may be $BaFe_{12}O_{17}$, where Ba is barium. In yet another embodiment, the magnetic particles may comprise an iron/cobalt alloy. In certain embodiments, the magnetic particles may include a coating such as a conformal tin (Sn)/tin-based alloy/copper (Cu) layer formed, for example, by a deposition procedure, such as sputtering. The coating is designed to promote desirable wetting between the molten (reflowed) solder of subsequently formed solder interconnect bumps (as will be discussed) and the magnetic particles.

The solder paste may be any appropriate material, including but not limited to lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. In one embodiment, the solder paste is a tin/silver solder.

Figure 3:
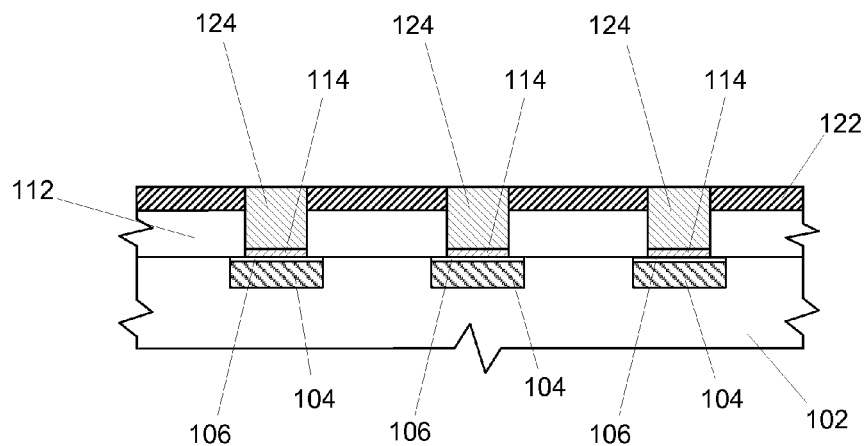
Figure 4:
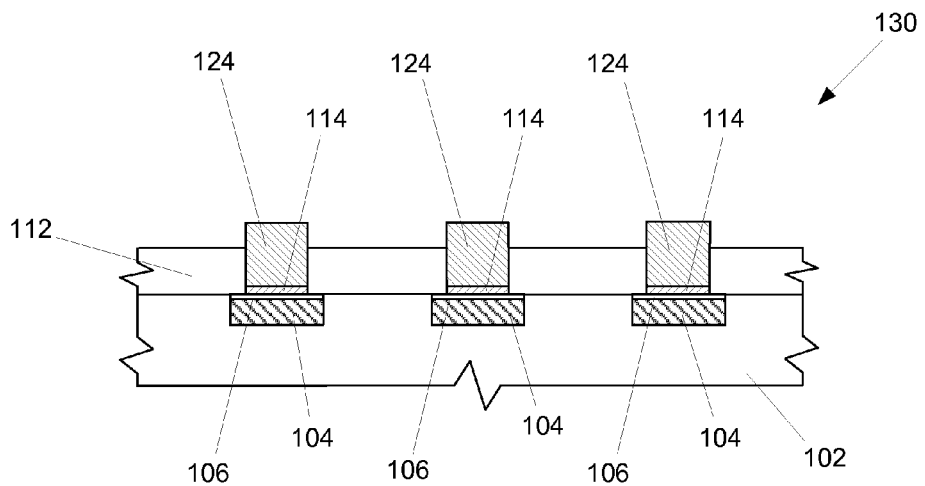

As shown in FIG. 3, a mask 122 may be placed the outer dielectric layer 112 and a solder material 124 may be deposited in the openings 108 (see FIGS. 1 and 2) by a printing technique. The solder material 124 may be any appropriate material, including but not limited to lead/tin alloys, such as tin/lead solder, or lead-free solders, such a pure tin or high tin content alloys, such as tin/bismuth, eutectic tin/silver, ternary tin/silver/copper, eutectic tin/copper, and similar alloys. The mask 122 may then be removed, as shown in FIG. 4. It is understood that the solder material 124 could be deposited by other techniques, including but not limited to spraying techniques.

The solder material 124 could be heated with an external heat source to a reflow temperature to form solder interconnect bumps and form an intermetallic compound interconnect between the substrate bond pads 104 and the solder material 124 for adhesion therebetween. However, one issue with such reflow heating is the non-uniformity of the heating rates across multiple solder interconnect bumps, resulting in differing intermetallic compound growth, as well as different texturing of the solder materials, as will be understood those skilled in the art.

Figure 5:
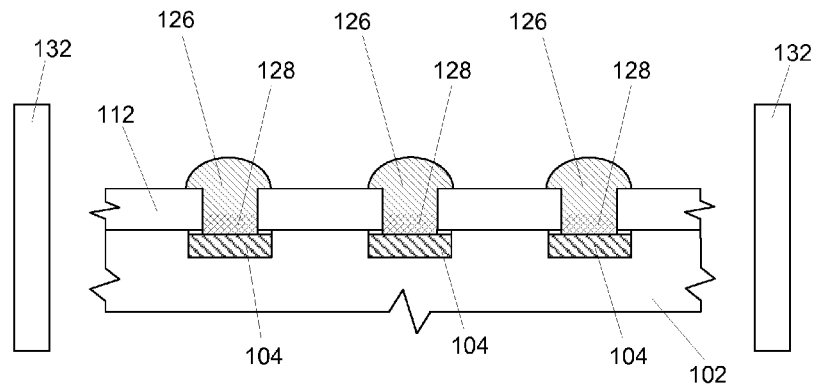

A magnetic field generator 132, as shown in FIG. 5, may be placed proximate the assembly 130 of FIG. 4. In the presence of alternating current magnetic fields generated by the magnetic field generator 132, the magnetic particles within the magnetic composite material 114 will generate heat by relaxational and hysteretic loss modes. Relaxational losses occur in single domain magnetic particles and they release heat when the magnetic moment of the particle rotates with the applied magnetic field (Neel motion) and when the particle itself rotates due to Brownian motion. Hystereis losses occur in multi-domain particles, and generate heat due to the various magnetic moments (due to multi-domains) rotating against the applied magnetic field. These losses occur with every cycle in the alternating current field, and the net heat generated increases with increasing number of field cycles. The various factors controlling heating rates may include, but are not necessarily limited to, magnetic particle size and size distribution, magnetic particle volume fractions (heat generation scales substantially linearly with volume fraction), magnetic material choice (oxides, metallic (pure and alloy), and layered magnetic particles (as previously discussed)), shape anisotropy of the magnetic particle, and the applied frequency and amplitude of the alternating current used in the magnetic field generator 132. Therefore, as shown in FIG. 5, when an alternating current magnetic field is applied by the magnetic field generator 132, the magnetic particles within the magnetic composite material 114 essentially vibrate and heat up to at least the reflow temperature of the solder material 124, thereby forming substrate interconnection bumps 126 and magnetic intermetallic compound interconnects 128. The magnetic intermetallic compound interconnects 128 may comprise the magnetic composite material 114, at least a portion of the finish layer 106, and a portion of the solder material 124, which diffuse into one another during heating. The magnetic intermetallic compound interconnect 128 adheres the substrate bond pad 104 to the solder material 124, as will be understood to those skilled in the art.

The use of the magnetic composite material 114 and the magnetic field generator 132 to form the magnetic intermetallic compound interconnects 128 may substantially reduce thermal mass variations in comparison to using an external heat source, and thereby may substantially reduce differences in intermetallic compound growth and/or different texturing of the solder materials, which may result in more reliable and predictable connections between microelectronic devices, as will be discussed. Furthermore, the use of the magnetic composite material 114 and the magnetic field generator 132 result in the formation the magnetic intermetallic compound interconnects 128 being dependent on the thickness of the magnetic composite material 114 and on the magnetic field generated by the magnetic field generator 132, as will be understood by those skilled in the art, which may improve control of the process.

It is understood that a number of variations of the present disclosure may be used. In one variation, the magnetic composite material 114 may be disposed only on selected substrate bond pads 104 and a magnetic field generator 132 may be used in conjunction with an external heat source (not shown) to form the solder interconnect bumps 126.

Figure 6:
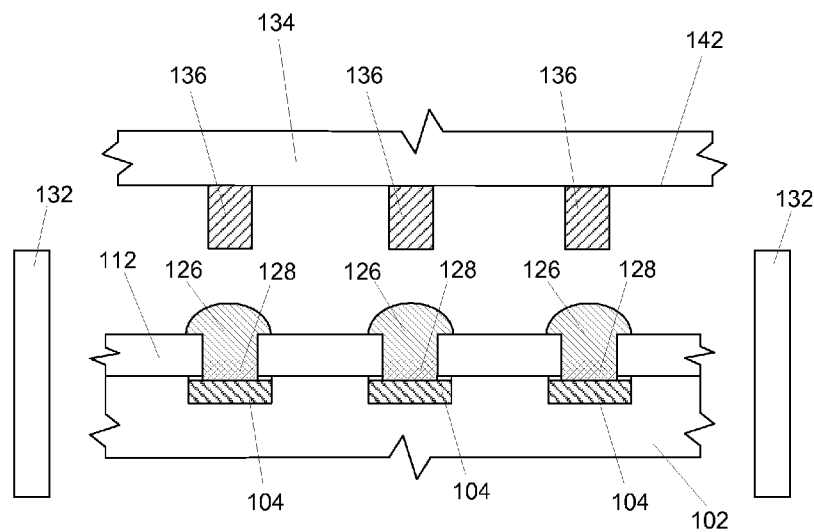
Figure 7:
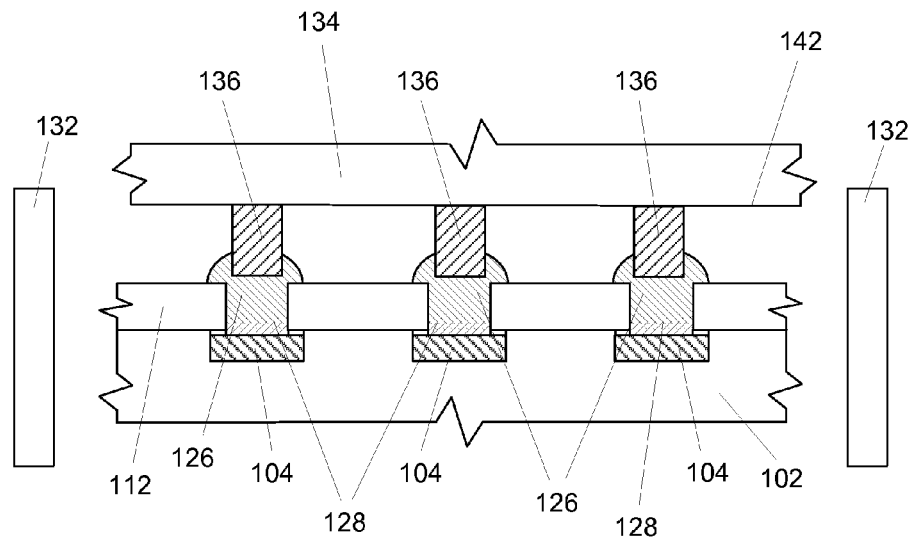
Figure 8:
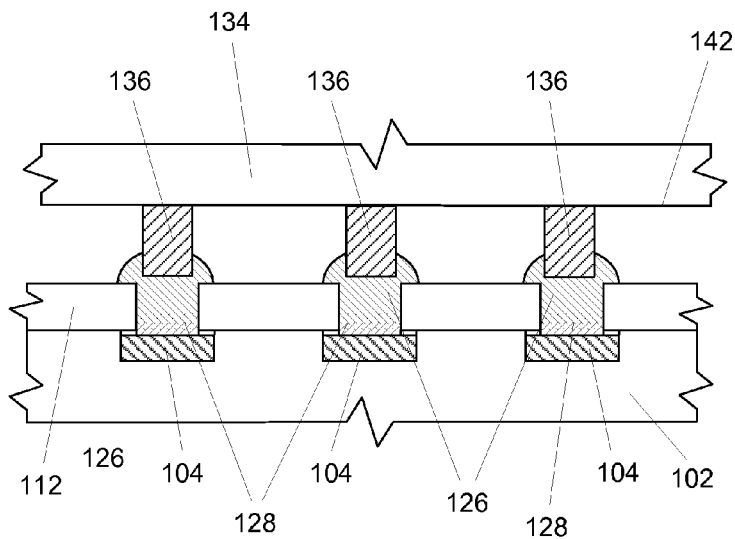

The magnetic intermetallic compound interconnects 128 of FIGS. 4 and 5 may be used to attach microelectronic devices or component to one another. FIGS. 6-8 illustrate the attachment of a microelectronic die to a substrate. As shown in FIG. 5, a microelectronic device 134, such as a microelectronic die or an interposer, may be provided having at least one attachment mechanism, such as at least on attachment projection 136 on a first surface 142 thereof. The attachment projections 136 may be any appropriate metal material, including but not limited to copper and alloys thereof. A pattern or distribution of the microelectronic die attachment projections 136 may be a substantial mirror-image to the pattern or distribution of the substrate interconnection bumps 126. The magnetic field generator 132 may then be activated to heat the magnetic composite material 114, which, in turn, brings the solder interconnection bumps 126 to their reflow temperature. As shown in FIG. 7, the microelectronic die attachment projections 136 may be inserted into their respective reflowed solder interconnection bumps 126. The magnetic field generator 132 may then be deactivated, or the substrate and the attached microelectronic die 134 may be removed from the magnetic field, which allows the solder interconnection bumps 126 to cool and re-solidify, as shown in FIG. 8.

Since the heating to reflow of the solder interconnection bumps 126 during the attachment to the microelectronic device 134 is localized proximate the magnetic intermetallic compound interconnects 128, other components (layer, traces, and the like) in the substrate are only minimally heated up by the magnetic field relative to external heating techniques. Thus, the magnetic heating of the present disclosure minimizes stresses due to thermal expansion mismatch.

Figure 9:
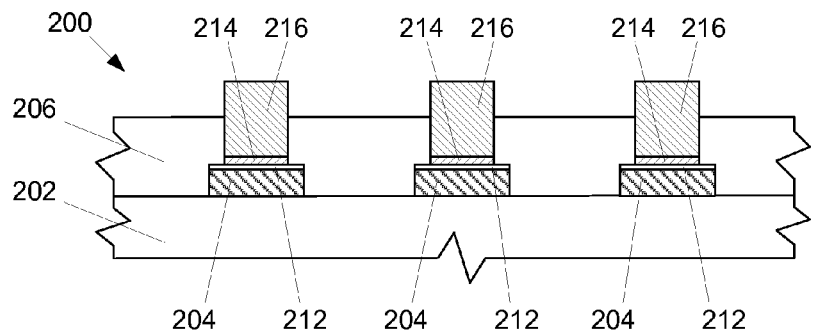
FIGS. 9-11 illustrate side cross-sectional views of a process of forming magnetic intermetallic compound interconnects on a microelectronic die and the attachment of a microelectronic device to the microelectronic die.
Figure 10:
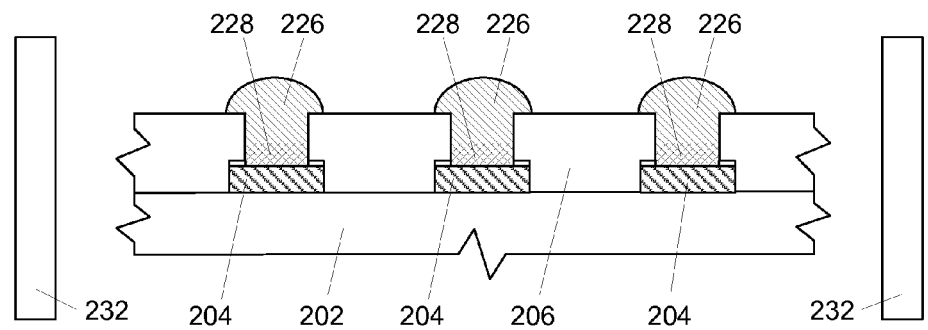

Another embodiment of the subject matter of the present description is shown in FIGS. 9 and 10, wherein solder interconnection bumps are formed on a microelectronic die. FIG. 9 illustrates a microelectronic die 200, such as a microprocessor, a chipset, a graphics device, a wireless device, a memory device, an application specific integrated circuit, or the like. The microelectronic die 200 may comprises first dielectric layer 202 with bond pads 204 formed thereon. An outer dielectric layer 206 may be formed over the first dielectric layer 202 and the microelectronic die bond pads 204. The microelectronic die bond pads 204 may be metal, including but not limited to, copper, silver, aluminum, gold, and alloys thereof. The microelectronic die bond pads 204 may be in electrical communication with conductive traces (not shown) within the microelectronic die 200. The first dielectric layer 202, the microelectronic die bond pads 204, and the outer dielectric layer 206 may be formed by any known techniques, as will be understood by those skilled in the art.

An optional conductive adhesion layer 212, such as titanium and alloys thereof, may be formed adjacent the microelectronic die bond pad 204. The conductive adhesion layer 212 may be formed by any known deposition technique, including but not limited to, chemical vapor deposition, atomic layer deposition, physical vapor deposition, plating, and the like.

The first dielectric layer 202 and/or the outer dielectric layer 206 may be a silicon oxide, silicon nitride, or low-K dielectric material (i.e. dielectric materials with a dielectric constant "K" lower than that of silicon oxide), including but not limited to carbon doped silicon dioxide and fluorine doped silicon dioxide. The outer dielectric layer 206 may also be a solder resist material, including but not limited to, epoxy and epoxy-acrylate resin.

A magnetic composite material 214, such as described with regard to FIGS. 2-4, may be formed adjacent the microelectronic die bond pad 204. As shown in FIG. 9, the magnetic composite material 214 may be formed on the conductive adhesion layer 212, and a solder material 216 deposited in openings (not shown) through the outer dielectric layer 206, similar to that described with regard to FIGS. 3 and 4.

As shown in FIG. 10, a magnetic field generator 232 may be placed proximate the microelectronic die 200 of FIG. 9. An alternating current magnetic field may then be applied by the magnetic field generator 232, the magnetic particles within the magnetic composite material 214 vibrate and heat up to at least the reflow temperature of the solder material 216, thereby forming magnetic intermetallic compound interconnects 228 and microelectronic die interconnection bumps 226.

Figure 11:
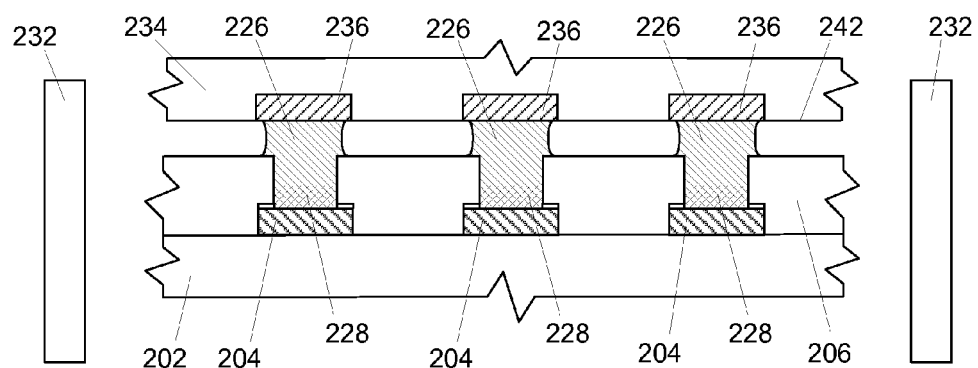

As shown in FIG. 11, a microelectronic device 234, such as an interposer or substrate, having a plurality of bond pads 236 on a first surface 242 thereof may be attached to the microelectronic die 200. A pattern or distribution of the microelectronic device bond pads 236 may be a substantial mirror-image to the pattern or distribution of the microelectronic die interconnection bumps 226. The magnetic field generator 232 may be activated to heat the magnetic intermetallic composite material 214, which, in turn, brings the solder material 216 to at least its reflow temperature. The microelectronic device bond pads 236 are brought into contact their respective reflowed microelectronic die solder interconnection bumps 226. The magnetic field generator 232 may then be deactivated, or the microelectronic die 200 and the microelectronic device 234 may be removed from the magnetic field, which allows the microelectronic die solder interconnection bumps 226 to cool and re-solidify to attach the microelectronic die 200 to the microelectronic device 234.

It is understood that the concepts of the present description apply to any microelectronic packaging process, including but not limited to First Level Interconnects (FLI) where microelectronic dice are attached to substrates or interposers, to Second Level Interconnects (SLI) where substrates or interposers are attached to a board or a motherboard, and to Direct Chip Attach (DCA) where microelectronic dice are attached directly attached to a board or a motherboard.

It is understood that the subject matter of the present description is not necessarily limited to specific applications illustrated in FIGS. 1-11. The subject matter may be applied to other solder attachment processes in the fabrication of microelectronic devices, including, but not limited to, attachment of electronic devices to a motherboard, attachment of integrated heat spreaders, and the like. Furthermore, the subject matter may also be used in any appropriate solder attachment application outside of the microelectronic device fabrication field.

Figure 12:
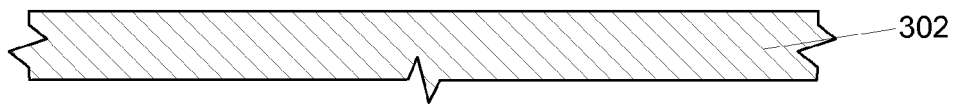
FIGS. 12-16 illustrate side cross-sectional views of a process of forming magnetic intermetallic compound interconnects on a first metallic attachment structure and the attachment of a second metallic attachment structure to the first metallic attachment structure.
Figure 13:
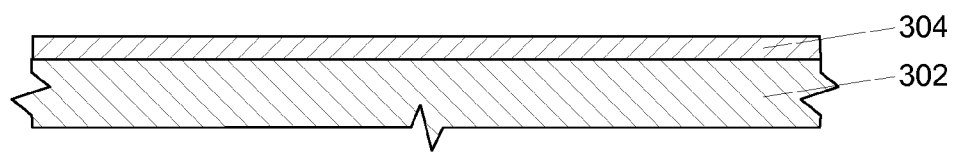
Figure 14:
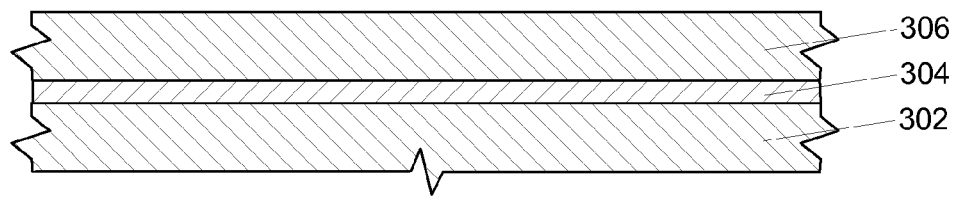
Figure 15:
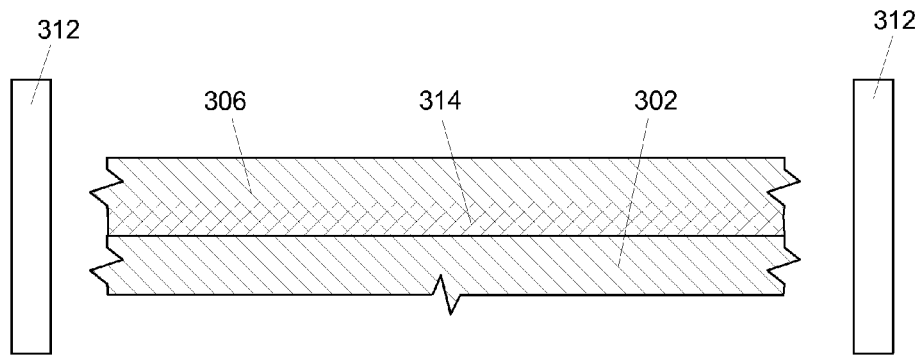
Figure 16:
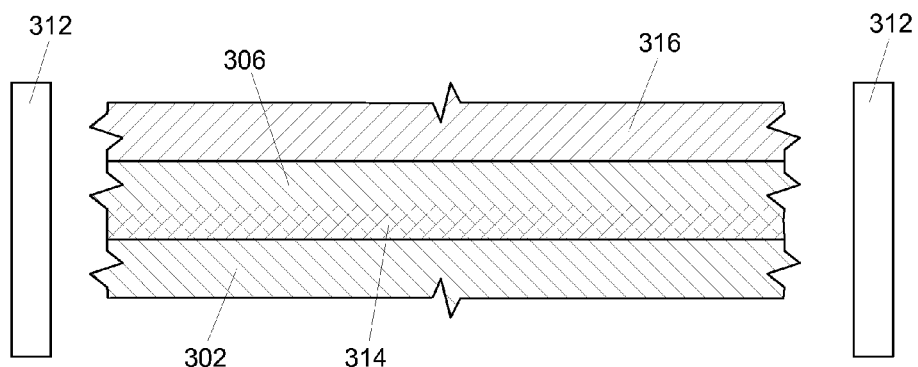
Figure 17:
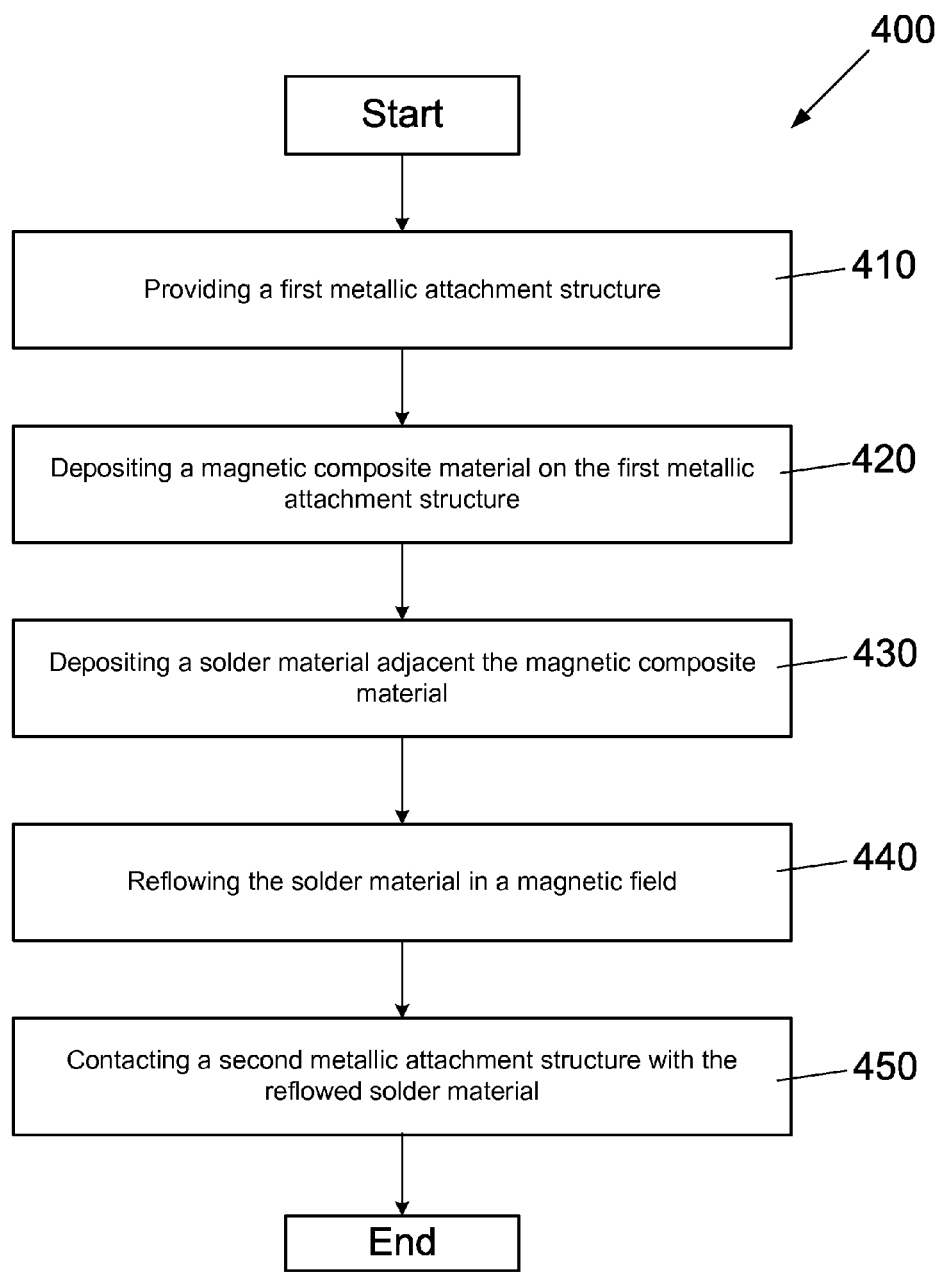
FIG. 17 is a flow diagram of a process of forming magnetic intermetallic compound interconnects on a first metallic attachment structure and the attachment of a second metallic attachment structure to the first metallic attachment structure.

An embodiment of a process of the present description is illustrated in FIGS. 12-16 and in the flow diagram 400 of FIG. 17. As shown in FIG. 12 and defined in block 410 of FIG. 17, a first metallic attachment structure 302 may be provided. The first metallic attachment structure 302 may be any appropriate structure, including, but not limited to, the substrate bond pad 104 of FIGS. 1-8 and the microelectronic die bond pad 204 of FIGS. 9-11. A magnetic composite material 304, such as previously described, may be deposited adjacent the first metallic attachment structure 302, as shown in FIG. 13 and defined in block 420 of FIG. 17. A solder material 306, such as previously described, may be deposited adjacent the magnetic composite material 304, as shown in FIG. 14 and defined in block 430 of FIG. 17. The solder material 306 may reflowed in an alternating current magnetic field that may be generated with a magnetic field generator 312 proximate the magnetic composite material 304, which forms a magnetic intermetallic compound 314, as shown in FIG. 15 and defined in block 440 of FIG. 17. As shown in FIG. 16 and defined in block 450 of FIG. 17, a second metallic attachment structure 316 may be brought into contact with the reflowed solder material 306. The second metallic attachment structure 316 may be any appropriate structure, including, but not limited to the microelectronic die attachment projections 136 of FIGS. 6-8 and the microelectronic device bond pads 236 of FIG. 11.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A method of fabricating a magnetic intermetallic compound interconnect, comprising:
   providing a first metallic attachment structure on a substrate;
   forming a dielectric layer over the substrate and the first metallic attachment structure, wherein the dielectric layer has an opening therethrough to expose a portion of the first metallic attachment structure;
   depositing a magnetic composite material adjacent the first metallic attachment structure within the dielectric layer opening;
   forming a mask on the dielectric layer after depositing the magnetic composite material, wherein the mask has an opening at the dielectric layer opening;
   depositing a solder material adjacent the magnetic composite material within the dielectric layer opening and the mask opening;
   removing the mask to expose a portion of the solder material outside the dielectric layer opening; and
   heating the solder material to a reflow temperature with a magnetic field imparted on the magnetic composite material.

2. The method of claim 1, wherein heating the solder material comprises heating the solder material to a reflow temperature with an alternating current magnetic field imparted on the magnetic composite material.

3. The method of claim 1, wherein depositing the magnetic composite material comprises depositing a magnetic composite material including magnetic particles dispersed in a solder paste.

4. The method of claim 3, wherein heating the solder material comprises vibrating the magnetic particles of the magnetic composite material with the magnetic field.

5. The method of claim 3, wherein depositing the magnetic composite material comprises depositing a magnetic composite material including magnetic particles comprises iron, cobalt, nickel, or alloys thereof dispersed in a solder paste.

6. The method of claim 5, wherein depositing the magnetic composite material comprises depositing a magnetic composite material including magnetic particles comprising an iron and cobalt alloy in a solder paste.

7. The method of claim 3, wherein depositing the magnetic composite material comprises depositing a magnetic composite material including magnetic particles dispersed in a tin and silver solder paste.

8. A method of fabricating a microelectronic package, comprising:
   providing a first metallic attachment structure on a substrate;
   forming a dielectric layer over the substrate and the first metallic attachment structure, wherein the dielectric layer has an opening therethrough to expose a portion of the first metallic attachment structure;
   depositing a magnetic composite material adjacent the first metallic attachment structure within the dielectric layer opening;

forming a mask on the dielectric layer after depositing the magnetic composite material, wherein the mask has an opening at the dielectric layer opening;

depositing a solder material adjacent the magnetic composite material within the dielectric layer opening and the mask opening;

removing the mask to expose a portion of the solder material outside the dielectric layer opening;

reflowing the solder material with a magnetic field imparted on the magnetic composite material; and contacting the solder material with a second metallic attachment structure.

9. The method of claim 8, wherein heating the solder material comprises heating the solder material to a reflow temperature with an alternating current magnetic field imparted on the magnetic composite material.

10. The method of claim 8, wherein depositing the magnetic composite material comprises depositing a magnetic composite material including magnetic particles dispersed in a solder paste.

11. The method of claim 10, wherein heating the solder material comprises vibrating the magnetic particles of the magnetic composite material with the magnetic field.

12. The method of claim 10, wherein depositing the magnetic composite material comprises depositing a magnetic composite material comprising magnetic particles comprises iron, cobalt, nickel, or alloys thereof dispersed in a solder paste.

13. The method of claim 12, wherein depositing the magnetic composite material comprises depositing a magnetic composite material including magnetic particles comprising an iron and cobalt alloy in a solder paste.

14. The method of claim 10, wherein depositing the magnetic composite material comprises depositing a magnetic composite material including magnetic particles dispersed in a tin and silver solder paste.

* * * * *